(12) United States Patent
Horne et al.

(10) Patent No.: US 7,076,385 B2
(45) Date of Patent: Jul. 11, 2006

(54) SYSTEM AND METHOD FOR CALIBRATING SIGNAL PATHS CONNECTING A DEVICE UNDER TEST TO A TEST SYSTEM

(75) Inventors: Stephen John Horne, El Granada, CA (US); Joseph Alig, Boulder Creek, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/996,173

(22) Filed: Nov. 23, 2004

(65) Prior Publication Data

US 2006/0111861 A1    May 25, 2006

(51) Int. Cl.
*G01D 18/00* (2006.01)
*G01R 31/00* (2006.01)

(52) U.S. Cl. .................. 702/89; 117/125; 117/176
(58) Field of Classification Search ................. 702/79, 702/85, 89, 117, 121, 122, 124, 176, 183, 702/186, 187, 125; 368/107, 113, 118, 121
See application file for complete search history.

(56) References Cited

U.S. PATENT DOCUMENTS

| | | | |
|---|---|---|---|
| 4,827,437 A * | 5/1989 | Blanton | .................. 702/89 |
| 5,402,073 A | 3/1995 | Ross | |
| 6,032,107 A | 2/2000 | Hitchcock | |
| 6,091,671 A | 7/2000 | Kattan | |
| 6,181,649 B1 | 1/2001 | Kattan | |
| 6,185,509 B1 | 2/2001 | Wilstrup et al. | |
| 6,194,925 B1 | 2/2001 | Kimsal et al. | |
| 6,226,231 B1 | 5/2001 | Kattan | |
| 6,298,315 B1 | 10/2001 | Li et al. | |
| 6,356,850 B1 | 3/2002 | Wilstrup et al. | |
| 6,393,088 B1 | 5/2002 | Emineth et al. | |
| 6,449,570 B1 | 9/2002 | Wilstrup et al. | |
| 6,609,077 B1 | 8/2003 | Brown et al. | |
| 6,799,144 B1 | 9/2004 | Li et al. | |
| 6,876,938 B1 * | 4/2005 | Kattan | ........................ 702/89 |

* cited by examiner

*Primary Examiner*—Bryan Bui
(74) *Attorney, Agent, or Firm*—Dority & Manning, P.A.

(57) ABSTRACT

The present technology involves an apparatus and method for calibrating a plurality of distinct signal paths connecting a device under test (DUT) to a time measurement device. The disclosed calibration circuit, which may be connected to the test setup throughout the testing process, measures the signal skew associated with each distinct signal path connecting a DUT, such as an integrated circuit, to a time measurement device, such as a time interval analyzer. The measured skew values, which may be collected throughout the testing process, are stored in memory. Such memory may be within the time measure device, an external storage device or a computing device that may be in communication with the time measurement device. The time measurement device uses the stored skew values to adjust the test signals to compensate for signal path related signal skew. In addition, the stored skew values are used to perform signal path diagnostics. This is accomplished by comparing newly measured skew values to stored skew values and generating a signal path failure signal when the newly measured skew values fall outside a user programmable range of acceptable skew values.

23 Claims, 4 Drawing Sheets

SYSTEM AND METHOD FOR CALIBRATING SIGNAL PATHS CONNECTING A DEVICE UNDER TEST TO A TEST SYSTEM

BACKGROUND OF THE INVENTION

The present technology relates to a method and apparatus for measuring the signal skew associated with each distinct signal path connecting a device under test (DUT), such as an integrated circuit or other electronic device, and associated tester equipment to a time measurement device, such as a time interval analyzer.

In general, an integrated circuit refers to an electrical circuit contained on a single monolithic chip containing active and passive circuit elements. As should be well understood in this art, integrated circuits are fabricated by diffusing and depositing successive layers of various materials in a pre-selected pattern on a substrate thereby imprinting a complex of electronic components and their interconnections. Materials used to manufacturer integrated circuits can include semiconductive materials such as silicon, conductive materials such as metals, and low dielectric materials such as silicon dioxide. The semiconductive materials contained in integrated circuit chips are used to form many basic electronic circuit elements, such as resistors, capacitors, diodes, and transistors.

The complexity of integrated circuits ranges from simple logic gates and memory units to large arrays capable of complete video, audio and print data processing. Integrated circuits are used in great quantities in electronic devices such as digital computers because of their small size, low power consumption and high reliability. The demand for faster and more efficient integrated circuits, however, has created various problems for circuit manufacturers. No manufacturing process is perfect and manufacturing imperfections in an integrated circuit may cause timing irregularities such as pulse-width deviation errors, to name only one type. As signal frequencies increase, the significance of any timing irregularities within integrated circuits also typically increases. By measuring certain characteristics of signal inputs and outputs of an integrated circuit, timing issues that may be present within the integrated circuit can be detected. Such information can then be used to assist integrated circuit manufacturers in developing improved integrated circuits or for detecting defects in mass-produced circuits.

In response to the needs for testing performance measures of integrated circuits and other electronic devices, specialized test systems have been developed to test the functional capabilities and reliability of such products. These test systems and associated components are generally referred to as "Automated Testing Equipment", and come in a variety of forms. Conventional ATE systems are not always capable of providing comprehensive measurements of integrated circuit I/O signals when such circuits operate at increasingly higher frequencies, such as those on an order of about 10 MHz–1 GHz or higher. As such, specialized time measurement devices have been more recently developed for measuring aspects of such higher frequency signals. An example of such a time measurement device corresponds to a time interval analyzer such as that disclosed in U.S. Pat. No. 6,091,671 (Kattan). Such a time measurement device is capable of making measurements relating to the time period between two or more input signal events where a "signal event" is generally defined as the specific instant in time at which an input signal reaches a certain predefined level. In addition, such a time measurement device is capable of measuring other time characterizations of a signal, such as rise time, fall time, pulse-width, period, frequency, duty cycle, time interval error and other characteristics that may reflect timing errors or frequency fluctuation in a signal.

Another important signal characteristic that is in need of measurement and qualification is the level of synchronization between two or more signals. Lack of such synchronization between signals is called skew. Skew is defined as time differences between similar events on two or more separate distinct signals where ideally there would be no time difference. Skew can be measured between an input and an output signal, between multiple input signals, or between multiple output signals. For example, a DUT is often driven by signals supplied by a test system. Such signals are typically generated by the test system and introduced to the DUT through cables, connects and/or other methods. It is frequently desirable to measure the skew between multiple input signals provided to a DUT by such a test system, and thus a need exists for measuring such skew and relating it to calibration needs of a test system.

BRIEF SUMMARY OF THE INVENTION

In view of the recognized need for calibration among signal paths in a test system, an improved calibration system and method has been developed. Likewise, to facilitate the development of increasingly faster integrated circuits, or for detecting defects in mass-produced integrated circuits, specialized test systems have been developed to measure high frequency signals. These specialized test systems require a time measurement device, such as a time interval analyzer or time counter, to perform such measurements. Within such a test system, there are multiple distinct connections, or signal paths, connecting a time measurement device to the multiple outputs of an integrated circuit. To enhance the precision of signal timing measurements, such connections should be calibrated to compensate for signal skew resulting from differences in path length and differences in the electrical characteristics of the distinct signal paths. This signal path calibration is preferably achieved in accordance with the disclosed circuitry and calibration method.

In general, the subject calibration system provides an ability to recognize and measure signal skew between distinct signal paths. By positioning the disclosed circuitry as close as possible to the DUT, in some cases incorporated into the loadboard for the DUT, desired calibration measurements can be obtained. Resistive networks are also preferably provided as part of the present calibration circuitry to offer effective isolation among selected components in the test system. By providing isolation between the calibration circuitry and the test system, the calibration circuitry can be connected to the test system throughout the testing process allowing calibration measurements to be performed as desired and when desired throughout the testing process.

One exemplary embodiment of the present technology relates to a calibration circuit for enabling skew measurements between two or more signals propagating along distinct signal paths connecting a device under test to a time measurement device. The calibration circuit preferably includes a signal source for injecting a calibration signal into respective injection points within each distinct signal path connecting the DUT to the time measurement device. The calibration circuit also preferably includes a plurality of sampling resistors, wherein at least one sampling resistor is connected between the DUT and each injection point within each distinct signal path. In one embodiment of the present technology, each sampling resistor is connected as close as possible to the DUT and supplies a scaled copy of the DUT I/O signal to the time measurement device. The signal source may be isolated from the signal paths by a plurality of isolation resistors wherein at least one isolation resistor is connected between the signal source and each injection point. Isolation of the signal source from each signal injection point may be further enhanced by providing a switch, preferably located between the isolation resistor and the signal source. Such a switch may be used, for example, to disconnect the signal source from the calibration circuit when the tester is performing DC measurements. There may be a plurality of switches wherein at least one switch is connected between the isolation resistor and the signal source for each distinct signal path, or a single switch may be connected between the junction of all distinct signal paths and the signal source. The calibration signal injected into the injection point could be generated by the main tester, which is part of the test setup, or by a dedicated function generator on or off the loadboard.

Yet another exemplary embodiment of the present technology relates to a loadboard with integrated calibration capabilities for use with automated testing equipment. Such a loadboard may comprise a substrate base and a calibration module. The substrate base preferably provides access to selected pins of the device under test. The calibration module is preferably located adjacent to the substrate base for enabling skew measurements among distinct signal paths connecting selected device under test pins to a time measurement device. Such a calibration module preferably includes a plurality of sampling resistors connecting selected device under test pins to respective first signal paths leading to a time measurement device thereby providing a junction defined as a calibration injection point. The calibration module also preferably includes a plurality of isolation resistors connecting each injection point to respective second signal paths leading to a signal source. The calibration module may also contain a signal source which provides a calibration signal to each of the injection points.

Additional embodiments of the present subject matter concern methodology for calibrating the distinct signal paths connecting a device under test (DUT) and associated automatic tester equipment to a time measurement device (TMD). One exemplary embodiment of such methodology concerns a method for measuring skew between signals propagating along distinct signal paths connecting a DUT to a TMD. A first step in such a method is to inject a calibration signal into respective injection points within each distinct signal path connecting a DUT to a TMD. A second step in such method is to select a measurement channel as the reference channel. Such a reference channel may be connected to one of the distinct signal paths connecting a DUT to a TMD or an accessory signal path connecting a signal source to a TMD. A third step in such method is to use a TMD to measure and record the signal skew of all calibration signals relative to the reference calibration signal. The skew values of all distinct signal paths may be recorded in memory by a control computer that is in communication with a TMD or within the TMD or both. These skew values are later used to correct the desired DUT test signal measurement values and achieve precise timing measurements regardless of the differences in length and electrical characteristic variations of different signal paths. A plurality of signal injection points are provided as close to the DUT as possible. A switch or plurality of switches may also be provided for disconnecting the signal source from the injection points when calibration measurements are not being performed.

Additional embodiments of the subject technology, not necessarily expressed in this summarized section, may include and incorporate various combinations of aspects of features, parts, or steps referenced in the summarized objectives above, and/or other features, parts, or steps as otherwise discussed in this application. Thus, the scope of the presently disclosed technology should in no way be limited to any particular embodiment.

Those of ordinary skill in the art will better appreciate the features and aspects of such embodiments, and others, upon review of the remainder of the specification.

BRIEF DESCRIPTION OF THE DRAWINGS

A full and enabling disclosure of the present technology, including the best mode thereof, directed to one of ordinary skill in the art, is set forth in the specification, which makes reference to the appended drawings, in which.

Figure 1:
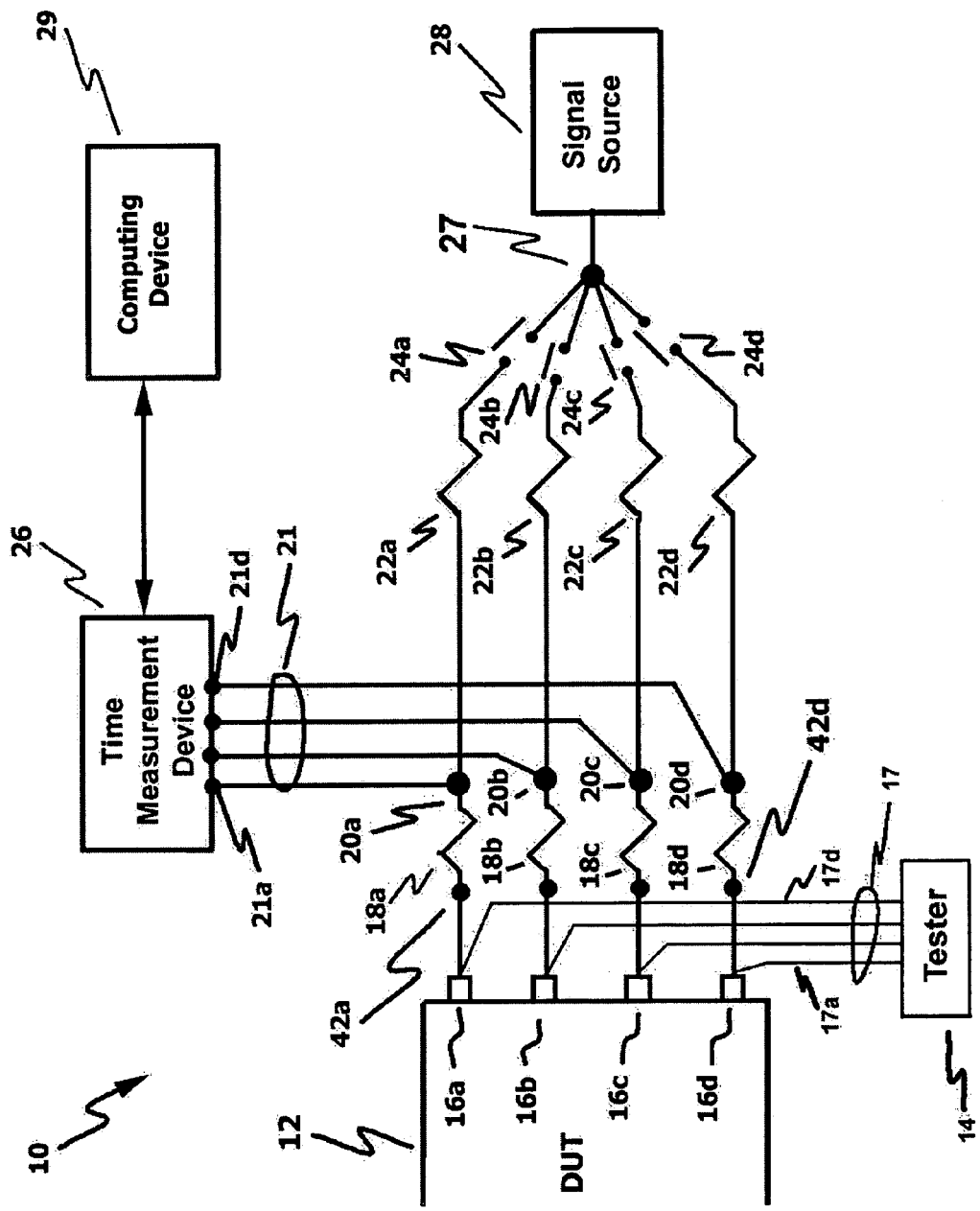
FIG. 1 is a circuit schematic diagram of an exemplary signal path calibration circuit for detecting and measuring signal path skew in accordance with the present subject matter.

Repeat use of reference characters in the present specification and drawings is intended to represent same or analogous features or elements of the disclosed technology.

DETAILED DESCRIPTION OF EXEMPLARY EMBODIMENTS

As previously discussed, the present technology relates to a method and apparatus for precision calibration of two or more distinct signal paths in a test setup. A signal path calibration system in accordance with the disclosed technology measures the signal skew associated with each distinct signal path connecting a device under test (DUT), such as an integrated circuit, to a time measurement device (TMD), such as a time interval analyzer. Signal skew measurements may be performed at selected times in conjunction with a DUT testing process. In addition, the measured skew values may be stored by the TMD. Such skew values may be used as needed to enhance the accuracy of DUT timing measurements by adjusting subsequent test signal timing measurements to compensate for skew between signal paths. Such stored skew values may also be used by a computing device to provide statistical analysis for signal path failure detection.

It should be noted that each of the exemplary embodiments presented and discussed herein should not insinuate limitations of the present subject matter. Features illustrated or described as part of one embodiment may be used in combination with aspects of another embodiment to yield yet further embodiments. Additionally, certain features may be interchanged with similar devices or features not expressly mentioned which perform the same or similar function. Reference will now be made in detail to the presently preferred embodiments of the subject technology.

Referring now to the drawings, FIG. 1 provides a block diagram illustration of exemplary signal path calibration system 10. A device under test (DUT) 12 is connected to a tester 14 at exemplary DUT pins 16a–16d, respectively, via four distinct test signal paths 17a–17d, respectively (hereafter referred to collectively as 17). DUT 12 may correspond in some examples to any type of integrated circuit (IC) or other electronic device, while tester 14 may correspond to one or more components of conventional automatic testing equipment. DUT pins 16a–16d are also connected to a first side of sampling resistors 18a–18d, respectively. A second side of sampling resistors 18a–18d connects to respective injection points 20a–20d. Injection points 20a–20d also connect to four separate inputs (measurement channels) 21a–21d, respectively (hereafter collectively referred to as 21) of time measurement device (TMD) 26. TMD 26 may in some embodiments correspond to a time interval analyzer such as disclosed in U.S. Pat. No. 6,091,671 (Kattan), which is incorporated by reference herein for all purposes. Injection points 20a–20d may also respectively connect to a first side of respective isolation resistors 22a–22d. The second side of isolation resistors 22a–22d connect to a first side of switches 24a–24d respectively. The second side of switches 24a–24d all connect to the output 27 of signal source 28. It should be appreciated in accordance with the setup of FIG. 1 that the present technology is not limited to calibrating four signal paths as illustrated. A greater or fewer number of paths may be calibrated in other embodiments.

Figure 2:
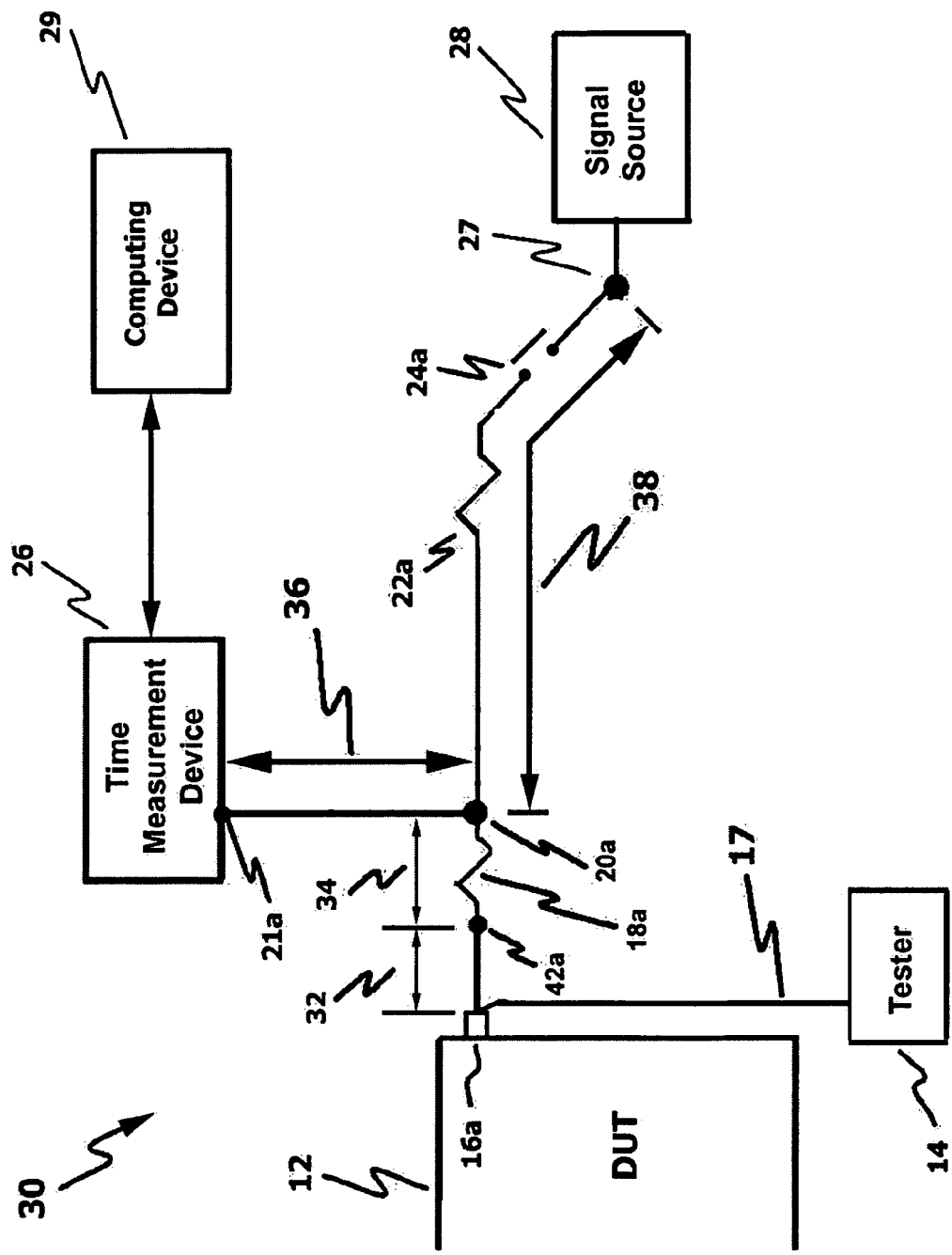
FIG. 2 is a circuit schematic diagram focusing on one exemplary signal path within a signal path calibration circuit, such as shown in FIG. 1.

Referring now to FIG. 2, a block diagram focusing on one distinct DUT signal path (DSP), and one distinct calibration signal path (CSP) of the signal path calibration system 10 of FIG. 1, is presented. It should be appreciated that the discussion of such single path may equally apply to others present in a calibration system of the present invention. The DSP spans from DUT pin 16a, through sampling resistor 18a, through injection point 20a to TMD input 21a (measurement channel A). The DSP length is the total distance represented by the sum of length 32 plus length 34 plus length 36. The CSP spans from output 27 of signal source 28, through switch 24a, through isolation resistor 22a through signal injection point 20a to TMD input 21a. The total CSP length is approximately equal to length 38 plus length 36.

Concerning the DSP, length 32 plus length 34 (hereafter referred to as the uncalibrated path length (UPL)), are not included in the CSP. In this exemplary embodiment of the present technology, length 36 (which is the dominant path among paths 32, 34 and 36 and hereafter referred to as the calibrated path length (CPL)) is the only section of the DSP that is calibrated. In addition, note that length 38, while included in the CSP, is not included in the DSP. Thus, to maximize the precision of the measured skew value for signal path A, at least the following three arrangements should be considered in accordance with certain exemplary embodiments of the present technology.

First, the UPL can be minimized. This may be accomplished by positioning point 42a as close to DUT pin 16a as possible, thereby minimizing distance 32. In addition, the signal injection point 20a should be as close as possible to sampling resistor 18a, thereby minimizing distance 34. Stated another way, signal injection point 20a should be located as close to the DUT pin 16a as possible.

Second, it may be desirable for the UPL (length 32+Length 34) to be short compared to the CPL (length 36). The longer the electrical length of a signal path, the greater the propagation delay. Thus, if the UPL is much shorter than the CPL, propagation delay due to the length of the UPL will be negligible compared to the propagation delay due to the length of the CPL.

Third, each UPL connecting a DUT pin to a signal injection point should have substantially identical electrical characteristics (signal lengths, impedances, capacitance, inductance, etc.). Notably, if the electrical characteristics of each UPL are substantially identical, signal skew between DUT test signals caused by such electrical characteristics will be minimized. Similarly, for all CSPs, the electrical characteristics of each signal path spanning length 38 would also preferably be identical. Thus, a goal for a CSP manufacturing process would be to have length 38 within each distinct CSP to be equal in length and to comprise switches and resistors having identical electrical characteristics. Finally, CSP length 38 should be short compared to CSP length 36.

Figure 3:
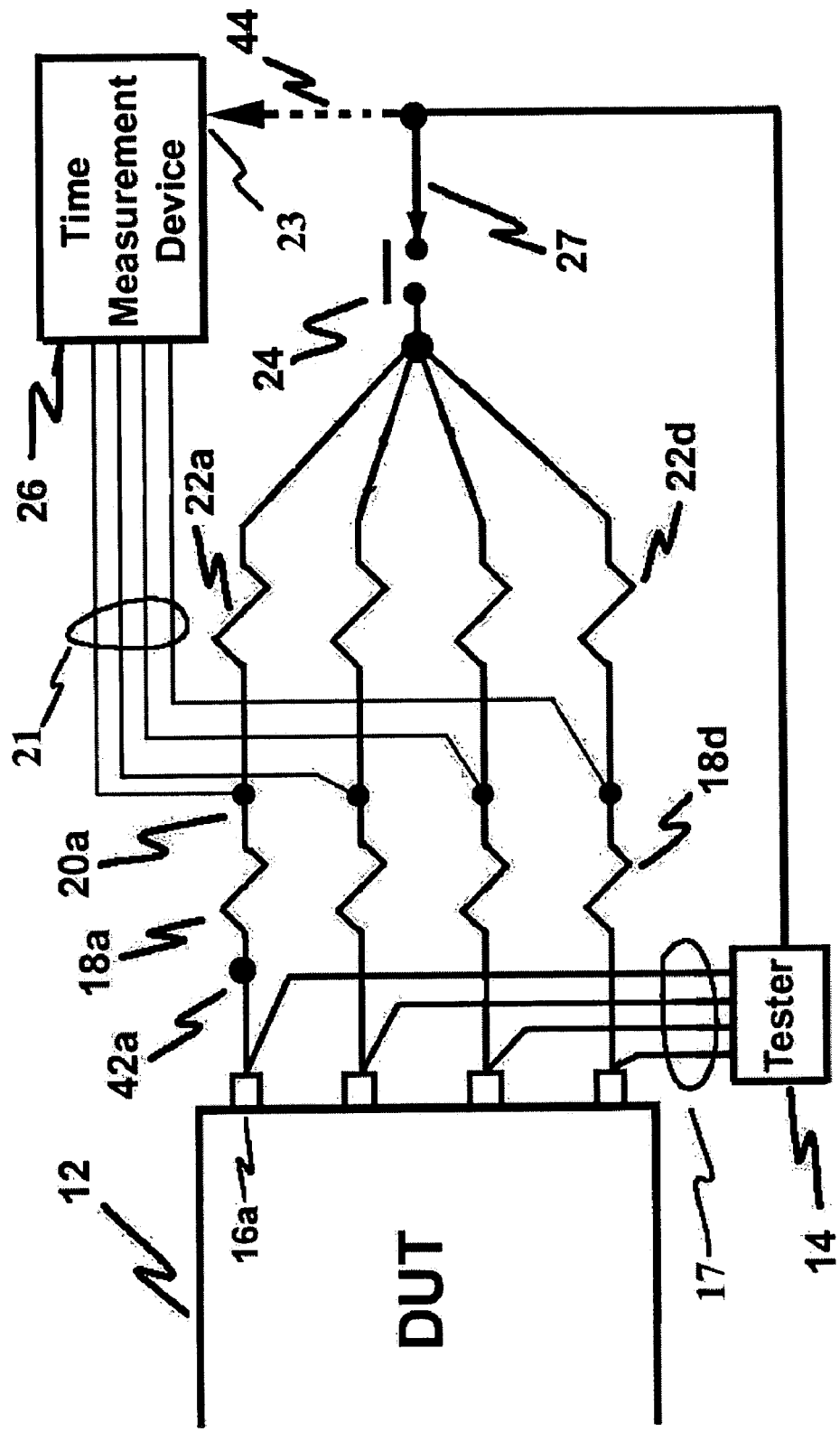
FIG. 3 is a circuit schematic diagram of an additional exemplary embodiment of a signal path calibration circuit for detecting and measuring signal path skew in accordance with the present subject matter.

FIG. 3 illustrates an alternative embodiment of the present technology. Note that in FIG. 3, switches 24a–24d as shown in FIG. 1 have been replaced by a single switch 24. No manufacturing process is perfect, and thus, switches 24a–24d (as shown in FIG. 1 and FIG. 2) will have some degree of variation in their electrical characteristics. Replacing switches 24a–24d by a single switch 24 eliminates this possible source of error.

Still referring to FIG. 3, note that in this alternative embodiment of the present technology, tester 14 generates calibration signal 27. Finally, note that an exemplary accessory calibration signal path 44 connects time measurement device 26 to the calibration signal source, tester 14. Accessory calibration signal path 44 preferably has known signal propagation characteristics and may be used as a reference signal path.

Reference now is made to the sampling resistors 18a–18d (hereafter collectively referred to as 18). As previously described, the sampling resistors 18 may physically be located as close as possible to DUT pins 16a–16d. A smaller component may be located closer to a DUT pin than can a larger component. While other electrical components, for example a relay, may be substituted for each sampling resistor 18, resistors are preferred over relays due to their compact size compared to the size of relays. In addition, relays typically cause more signal reflections than do resistors.

Importantly, the signal path calibration system should not load the signal paths from DUT 12 to tester 14. The impedance value for each sampling resistor 18 is preferably selected so that the sampling resistor 18 effectively hides the loading of the time measurement device 26 from signal paths 17 between the DUT 12 to tester 14. Such is accomplished by selecting an impedance value for each sampling resistor 18 that is large compared to the impedance of test signal path 17. In addition, sampling resistors 18 are selected to provide a scaled duplicate of the DUT test signal to the TMD 26. In some embodiments, the scaled DUT test signal would be about 10% of the unscaled DUT test signal. For signal path impedances near a typical value of about 50 Ω, the value for isolation resistor 18 to result in a ten percent (10%) scaled test signal is preferably about 450 Ω. Notably, for such an exemplary embodiment of the present technology, a 450 Ω sampling resistor 18 will have nine times the impedance of signal path 17 (having a 50 Ω impedance) and will prevent loading of the test signal paths 17 between DUT 12 to tester 14.

Reference now is made to the isolation resistor 22a shown in FIGS. 1 and 2. It should be appreciated that the following description concerning resistor 22a should also apply to resistors 22*b*, 22*c* and 22*d*. The impedance value of isolation resistor 22*a* is preferably selected to prevent significant reduction in amplitude of the signals arriving at TMD 26. Notably, one result of including an isolation resistor 22 is that only a scaled down version of the calibration signal on path 27 will reach TMD 26. An exemplary value for resistor 22*a* is 450 Ω. It will be appreciated, however, that including isolation resistor 22 may not be necessary, particularly when switch 274 remains open during DUT timing measurements.

Skew Measurements:

Referring again to FIG. 1, in one embodiment of the present technology, the calibration system 10 is connected to the DUT test setup as shown. In one embodiment of the present technology, there is no requirement to disconnect the calibration system 10 from the DUT test setup during the DUT testing process. DUT signal path (DSP) skew measurements may be performed, for example, after every 100 DUT test cycles. In some embodiments, the measured DSP skew values may be stored in memory within TMD 26. Alternatively, the DSP skew values may be stored in a computing device 29 that is in communication with TMD 26. Skew values may be stored in a table with values such as represented in exemplary Table 1 below.

TABLE 1

| Channel | A | B | C | D |
|---------|---|---|---|---|
| Skew | 0 | 160 ps | −420 ps | 800 ps |

Stored DSP skew values may be used to compensate for timing deviations in the DUT test signals (for each distinct signal path connecting a DUT 12 to a TMD 26) resulting from signal path signal skew, thereby enhancing the precision of the DUT test signal measurements.

Referring again to FIG. 1, consider calibration signal paths (CSP) A, B, C, and D. CSP-A (calibration signal path A), for example, spans from signal source 28 through switch 24*a* through isolation resistor 22*a* to signal injection point 20*a*. Similarly, CSP-B spans from signal source 28 through switch 24*b* through isolation resistor 22*b* to signal injection point 20*b*. CSP-C and CSP-D are defined in a similar manner. One signal path, CSP-A, for example, may be selected as the reference signal path (making TMD input 21*a* the reference channel). Alternatively, accessory calibration signal path 44 such as illustrated in FIG. 3 may be selected as the reference signal path. For the purposes of the following example, accessory calibration signal path 44 will be the reference signal path.

Now suppose a 1 MHz calibration signal is injected into injection points 20*a*–20*d* and accessory calibration signal path 44. The TMD 26 makes the following skew measurements in relation to the rising edge of the 1 MHz calibration signal applied to TMD input 23 (FIG. 3) via the accessory calibration signal path 44: (1) at CSP-A TMD input, the rising edge of the calibration signal occurs 1.350 ns later than the reference signal, (2) at CSP-B TMD input, the rising edge of the calibration signal occurs 1.510 ns later than the reference signal, (3) at CSP-C TMD input, the rising edge of the calibration signal occurs 0.930 ns later than the reference signal, and (4) at CSP-D TMD input, the rising edge of the calibration signal occurs 2.150 ns later than the reference signal. Such skew measurements would preferably be stored in a memory table as described above and depicted in Table 1. If the TMD measurement channel connected to CSP-A is selected as the reference channel, the relative skew values are calculated as follows:

(1) CSP-A skew = 1.350 ns − 1.350 ns = 0 ps;
(2) CSP-B skew = 1.510 ns − 1.350 ns = 160 ps;
(3) CSP-C skew = 0.930 ns − 1.350 ns = −420 ps; and
(4) CSP-D skew = 2.150 ns − 1.350 ns = 800 ps.

Now suppose the tester generates test signals to exercise DUT 12 and the DUT generates output signals on DUT pins 16*b* and 16*c*. The time measurement device 26 measures selected rising edges of DUT output signals 16*b* and 16*c*. To compensate for signal path signal skew, the time measurement device 26 may then access the average skew values stored in memory (see Table 1) and add 160 ps to the CSP-B signal measurements, subtract 420 ps from the CSP-C signal measurements, and add 800 ps to the CSP-D signal measurements.

Signal Path Diagnostics:

Another advantage of storing the measured skew values in memory may be exploited by comparing newly measured skew values with previously measured skew values. For any particular frequency of interest, signal path signal skew should not vary widely over time. For example, assume that the last 100 signal skew values for Test Signal Path A (TSP-A) are stored in memory, such 100 skew values having an average skew value of 1.4 ns with a standard deviation of 0.28 ns (20%). Now suppose time measurement device 26 determines a newly measured skew value to be 2.4 ns, a 71% increase in the skew value. While some variation in signal path signal skew will occur, such a wide variation in signal path signal skew is an indication of significant changes in the electrical characteristics of a signal path. Significant changes in the electrical characteristics of a signal path may be an indication of a problem with such signal path or signal path error indication. When newly measured skew values fall outside a predetermined range of acceptable skew values, based on previous measurements or some other criteria, test measurement device 26 (or computing device 29), would preferably generate a signal path skew value warning signal.

For example, the skew memory table, such as Table 2 presented below, could also include skew delta values used for signal path error detection. An exemplary skew delta value may correspond to ±10% of the average skew value for each channel.

TABLE 2

| Channel | A | B | C | D |
|---------|---|---|---|---|
| Skew | 0 | 160 ps | −420 ps | 800 ps |
| Delta | 10% | 10% | 10% | 10% |

In this exemplary embodiment of the present technology, if the percent change in skew value is greater than the delta value, an error indication is generated. In one embodiment of the present technology, such skew delta values would be programmable based on desired user tolerance levels.

Figure 4A:
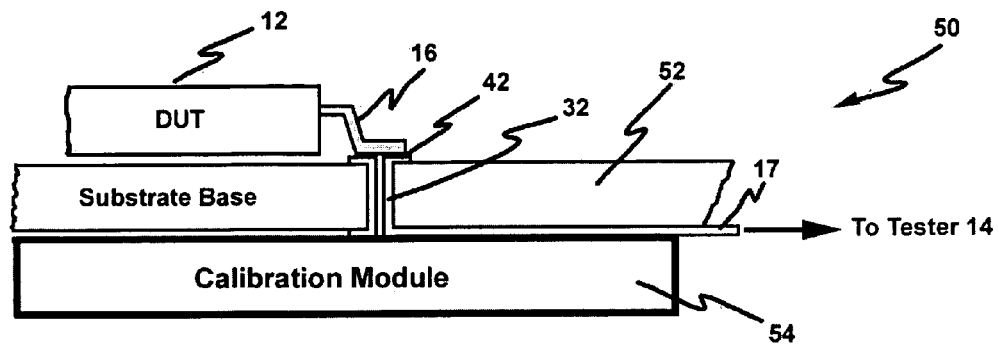
FIGS. 4a and 4b display respective cross-sectional views of an exemplary loadboard configuration for use with the automated test equipment in accordance with the present subject matter.

The Loadboard:

Referring now to FIG. 4*a*, a cross-sectional illustration of an exemplary loadboard 50 with integrated calibration capabilities is depicted. In this exemplary embodiment of the present technology, DUT 12 is positioned above a substrate base 52, which is often referred to as a loadboard. A loadboard typically provides a structural and electrical interface between a DUT and other devices in a test setup.

Substrate base 52 provides access to DUT pin 16 via signal path 32. Attached adjacent to the substrate base 52 is a calibration module 54. The calibration module, which includes signal path calibration components as previously described is preferably positioned as close as possible to DUT 12.

Figure 4B:
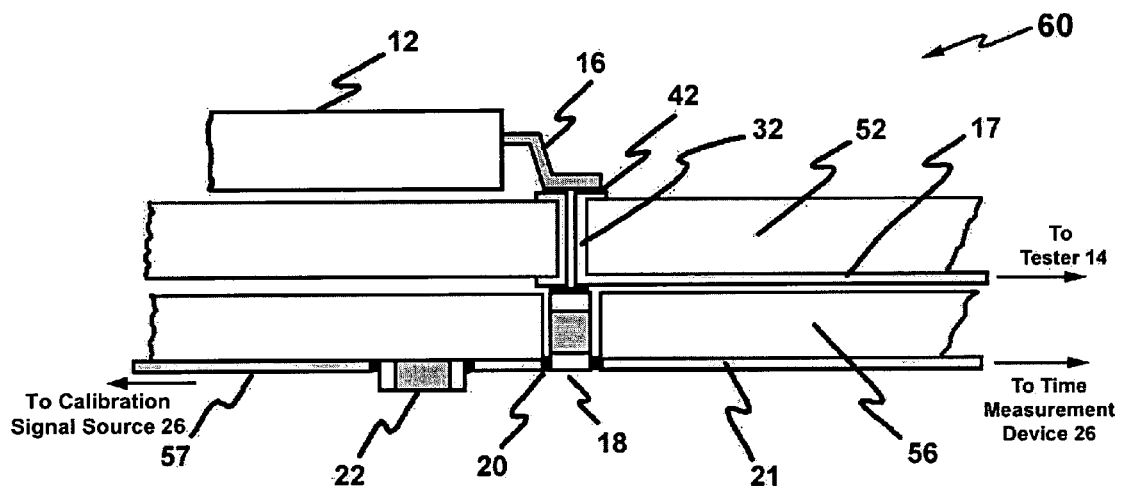

Referring now to FIG. 4*b*, a more particular loadboard 60 includes an exemplary embodiment of calibration module 54. In this embodiment, calibration module 54 comprises a calibration substrate board 56 with a plurality of sampling resistors 18. The sampling resistors are preferably integrated within the interior of the calibration substrate board 56, thereby placing one side of each sampling resistor in electrical contact with selected pins of DUT 12.

To simplify the disclosure of the calibration substrate board technology, only one sampling resistor 18 is shown in FIG. 4*b*. However, the following description may be applied to all sampling resistors within the calibration substrate board 56. A first side of sampling resistor 18 is in electrical contact with signal path 32. A second side of sampling resistor 18 is in electrical contact with signal path 21 leading to a time measurement device 26. The junction between sampling resistor 18 and signal path 21 is defined as a calibration signal injection point 20. As stated above, it is preferred that sampling resistor 18 be integrated within the interior of the calibration substrate board 56 placing a first side of sampling resistor 18 in direct contact with signal path 32 leading to DUT pin 16, thereby minimizing the distance between sampling resistor 18 and DUT pin 16. In addition, a second side of sampling resistor 18 is in electrical contact with signal path 57 leading to a calibration signal source 28. Additionally, within signal path 57, between injection point 20 and signal source 28, an isolation resistor 22 may be inserted.

While the present subject matter has been described in detail with respect to specific embodiments thereof, it will be appreciated that those skilled in the art, upon attaining an understand of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A calibration circuit for enabling skew measurement between test signals propagating along distinct signal paths connecting a device under test and associated automatic tester equipment to a peripheral time measurement device, said calibration circuit comprising:
   a signal source for injecting a calibration signal into respective injection points within said distinct signal paths connecting the device under test to the time measurement device; and
   a plurality of sampling resistors, wherein at least one sampling resistor is connected between the device under test and the injection point within each distinct signal path, for supplying a scaled test signal to the time measurement device.

2. A calibration circuit as in claim 1, wherein the path length between the device under test and the injection point within each distinct signal path is significantly shorter that the path length between the injection point and the time measurement device.

3. A calibration circuit as in claim 1, wherein the impedance of each said sampling resistor is at least twice as large as the impedance of any distinct signal path connecting the device under test to the associated automatic tester equipment.

4. A calibration circuit as in claim 1, further comprising a memory for storing selected signal path skew measurements obtained via said calibration circuit.

5. A calibration circuit as in claim 1, wherein the stored skew measurements are used by the time measurement device to adjust signal timing measurements when performing a device under test timing measurement.

6. A calibration circuit as in claim 1, wherein newly measured signal path skew measurements are compared to signal path skew measurements stored in said memory and an error indication is generated when the newly measured signal path skew measurements fall outside a predetermined range of signal path skew values.

7. A calibration circuit as in claim 1, further comprising at least one switch for enabling or disabling the connection between the signal source and the injection point within each distinct signal path.

8. A calibration circuit as in claim 1, further comprising a plurality of isolation resistors, wherein at least one isolation resistor is connected between said at least one switch and the injection point within each distinct signal path.

9. A calibration circuit as in claim 1, wherein said signal source comprises the automatic tester equipment.

10. A calibration circuit as in claim 1, further comprising a loadboard for receiving the device under test and for housing said plurality of sampling resistors.

11. A method for measuring skew between signals propagating along distinct signal paths connecting a device under test to a time measurement device, comprising the steps of:
    providing a plurality of sampling resistors, wherein at least one sampling resistor connects the device under test and an injection point within each distinct signal path connecting the device under test to the time measurement device, for providing a scaled test signal to the time measurement device when skew calibration is not being performed; injecting a calibration signal from a calibration signal source into respective injection points within each distinct signal path connecting a device under test to a time measurement device, thereby creating a calibration signal for each distinct signal path;
    selecting a measurement channel as a reference channel; and
    using said time measurement device to measure the skew of all calibration signals relative to the skew value for the reference channel.

12. A method for measuring skew as in claim 11, wherein said selecting step comprises selecting one of said distinct signal path calibration signals as the reference calibration signal.

13. A method for measuring skew as in claim 11, further comprising a step of determining the skew between calibration signals by determining the difference in time between the reference calibration signal and other received calibration signals for each distinct signal path connecting a device under test to a time measurement device.

14. A method for measuring skew as in claim 11, further comprising a step of storing the skew values for each distinct signal path in a memory associated with the time measurement device.

15. A method for measuring skew as in claim 11, wherein the skew values for each distinct signal path are stored by a computing device in communication with the time measurement device.

16. A method for measuring skew as in claim 15, wherein each respective newly measured skew value is compared to each respective stored skew value for each distinct signal path and an error indication is generated when a newly measured skew value falls outside a predetermined range of skew values.

17. A method for measuring skew as in claim 15, further comprising a step of adjusting DUT timing measurements based on the skew values stored in the time measurement device.

18. A method for measuring skew as in claim 11, wherein the impedance of each said sampling resistor is at least twice as large as the impedance of any distinct signal path connecting the device under test to a tester.

19. A method for measuring skew as in claim 11, further comprising a step of providing at least one switch for enabling or disabling the connection between the calibration signal source and the injection points within each distinct signal path.

20. A method for measuring skew as in claim 19, further comprising a step of providing a plurality of isolation resistors wherein at least one isolation resistor is connected between each calibration signal injection point and the calibration signal source to prevent loading of each distinct signal path connecting the device under test to the time measurement device.

21. A loadboard with integrated calibration capabilities for use with automated testing equipment, wherein said loadboard is configured to interface with a device under test, said loadboard comprising:
  a substrate base wherein said substrate base provides access to selected pins of the device under test; and
  a calibration module provided in adjacent contact with said substrate base for enabling skew measurements among distinct signal paths from selected device under test pins to a time measurement device
  wherein said calibration module comprises a plurality of sampling resistors connecting selected device under test pins to respective first signal paths leading to a time measurement device, wherein the junction between each said sampling resistor and its respective first signal path is defined as an injection point; and
  a plurality of isolation resistors connecting each injection point to respective second signal paths leading to a signal source, wherein the signal source provides a calibration signal to each of the injection points.

22. A loadboard with integrated calibration capabilities as in claim 21, wherein the impedance of each said sampling resistor is at least twice as large as the impedance of any first signal path connecting the device under test to the time measurement device.

23. A loadboard with integrated calibration capabilities for use with automated testing equipment, wherein said loadboard is configured to interface with a device under test, said loadboard comprising:
  a substrate base wherein said substrate base provides access to selected pins of the device under test; and
  a calibration module provided in adjacent contact with said substrate base for enabling skew measurements among distinct signal paths from selected device under test pins to a time measurement device,
  wherein said calibration module further comprises a calibration substrate board wherein said sampling resistors are integrated within the interior of said calibration substrate board, thereby placing one side of each said sampling resistor in electrical contact with selected pins of a device under test, and placing the other end of each said sampling resistor in electrical contact with its respective first signal path leading to the time measurement device and with its respective second signal path leading to the signal source.

* * * * *